(12) United States Patent
Jeddeloh

(10) Patent No.: US 8,327,225 B2
(45) Date of Patent: Dec. 4, 2012

(54) ERROR CORRECTION IN A STACKED MEMORY

(75) Inventor: Joe M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 317 days.

(21) Appl. No.: 12/651,910

(22) Filed: Jan. 4, 2010

(65) Prior Publication Data

US 2011/0167319 A1 Jul. 7, 2011

(51) Int. Cl.
*G11C 29/00* (2006.01)
(52) U.S. Cl. .......................................... 714/763; 714/758
(58) Field of Classification Search .................. 714/758, 714/765, 810, 763
See application file for complete search history.

(56) References Cited

U.S. PATENT DOCUMENTS

| | | | | |
|---|---|---|---|---|
| 5,680,579 A * | 10/1997 | Young et al. | | 711/157 |
| 6,125,466 A * | 9/2000 | Close et al. | | 714/758 |
| 7,373,584 B2 * | 5/2008 | Ito et al. | | 714/763 |
| 7,558,096 B2 | 7/2009 | Ikeda | | 365/51 |
| 7,765,454 B2 * | 7/2010 | Passint | | 714/763 |
| 7,996,734 B2 * | 8/2011 | Earle et al. | | 714/718 |
| 8,037,234 B2 * | 10/2011 | Yu et al. | | 711/103 |
| 2001/0001158 A1 * | 5/2001 | Tetrick | | 714/763 |
| 2002/0083390 A1 | 6/2002 | Lee et al. | | |
| 2002/0133783 A1 * | 9/2002 | Oldfield et al. | | 714/800 |
| 2003/0033572 A1 * | 2/2003 | Walton et al. | | 714/763 |
| 2004/0003337 A1 * | 1/2004 | Cypher | | 714/763 |
| 2006/0126369 A1 * | 6/2006 | Raghuram | | 365/51 |
| 2006/0164882 A1 | 7/2006 | Norman | | |
| 2007/0011574 A1 * | 1/2007 | Weiss et al. | | 714/763 |
| 2007/0058410 A1 * | 3/2007 | Rajan | | 365/63 |
| 2007/0113150 A1 * | 5/2007 | Resnick et al. | | 714/763 |
| 2008/0010435 A1 | 1/2008 | Smith et al. | | |
| 2008/0084725 A1 * | 4/2008 | Lahtinen et al. | | 365/51 |
| 2008/0130395 A1 * | 6/2008 | Silvestri | | 365/230.06 |
| 2008/0256420 A1 * | 10/2008 | Hafner et al. | | 714/770 |
| 2009/0193301 A1 * | 7/2009 | Ito et al. | | 714/704 |
| 2011/0041037 A1 * | 2/2011 | Frost et al. | | 714/763 |
| 2011/0258512 A1 * | 10/2011 | Flynn et al. | | 714/758 |

FOREIGN PATENT DOCUMENTS

WO WO-2011082070 A3 7/2011

OTHER PUBLICATIONS

"International Application Serial No. PCT/US2010/061835, International Search Report mailed Aug. 8, 2011", 5 pgs.
"International Application Serial No. PCT/US2010/061835, Written Opinion mailed Aug. 8, 2011", 4 pgs.

* cited by examiner

*Primary Examiner* — Yolanda L Wilson
(74) *Attorney, Agent, or Firm* — Schwegman, Lundberg & Woessner, P.A.

(57) ABSTRACT

Electronic apparatus, systems, and methods to construct and operate the electronic apparatus and/or systems include a stack of memory dies with user data and/or first level error correction data stored in a stripe across the memory dies. One such stack can include a second level error correction vault, such as a parity vault, to store parity data corresponding to the user data and/or first level error correction data. Additional apparatus, systems, and methods are disclosed.

35 Claims, 4 Drawing Sheets

ERROR CORRECTION IN A STACKED MEMORY

BACKGROUND

The market for electronic apparatus and systems is driving industry to higher operating speeds for processors and enhanced memory capacity in the devices operating with such processors. Concurrent with this enhanced functionality is enhanced complexity and consumption of power. As memory capacity increases, so does the chance of storage or recall.

A number of configurations in computer memory exist to protect data against memory device failure. Error correction schemes, such as the Chipkill™ memory architecture, exist to protect computer memory systems from single memory chip failure as well as multi-bit errors from any portion of a single memory chip. In the Chipkill™ architecture, bits of multiple words of error correction code (ECC) data are scattered across multiple memory chips, such that the failure of any one memory chip will affect each ECC value so as to resemble the occurrence of multiple correctable errors. This configuration allows memory contents to be reconstructed despite the complete failure of one chip. More complex error correction schemes are seldom implemented, because additional memory and chip area are required.

BRIEF DESCRIPTION OF THE DRAWINGS

Embodiments of the invention are illustrated by way of example and not limitation in the figures of the accompanying drawings in which.

DETAILED DESCRIPTION

The following detailed description refers to the accompanying drawings that show, by way of illustration, and not limitation, various embodiments of the invention. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
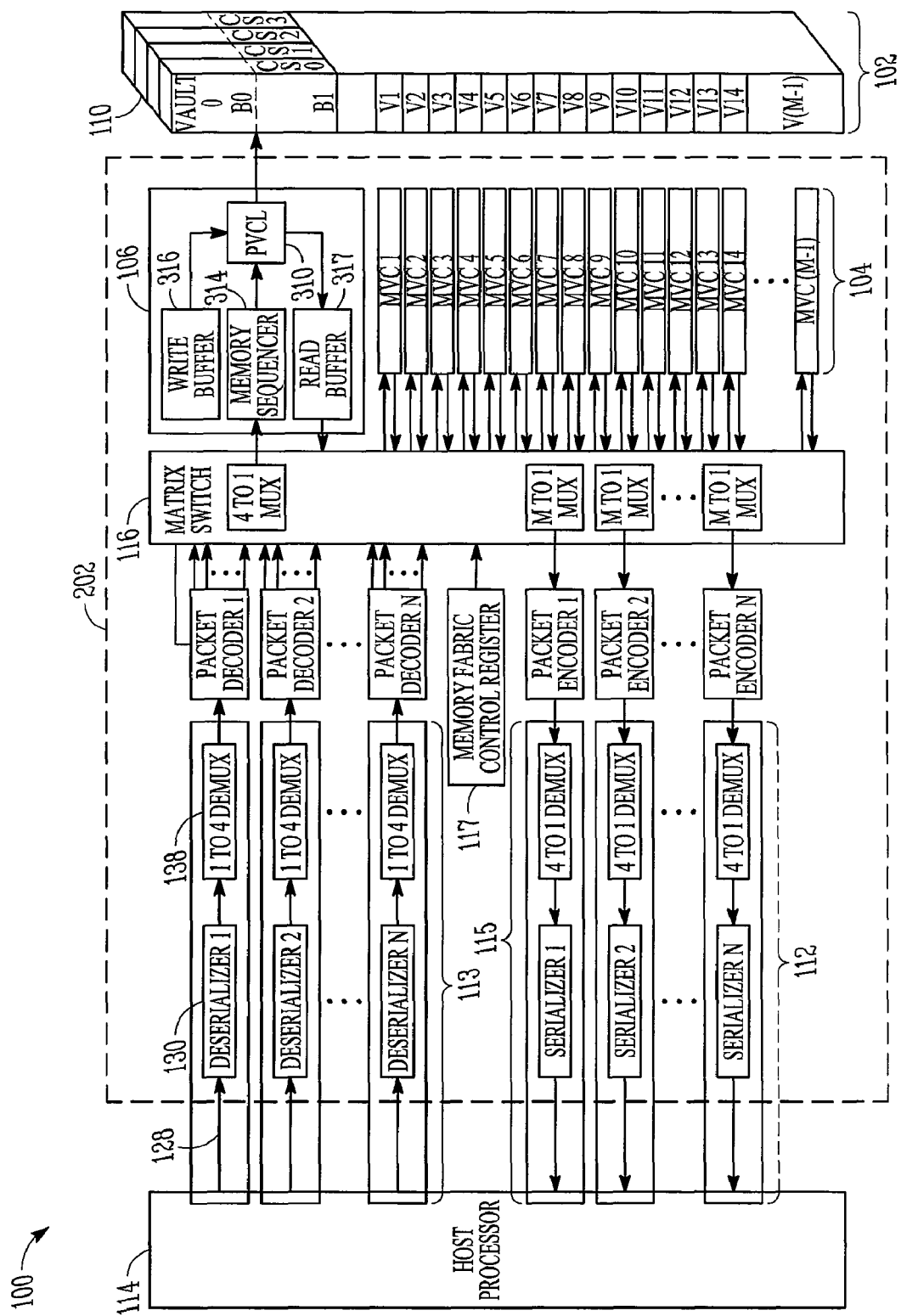
FIG. 1 shows a block diagram of a memory device, according to various example embodiments.

FIG. 1 shows a block diagram of a memory device 100 according to various example embodiments. Memory device 100 operates to substantially concurrently transfer a plurality of outbound and/or inbound streams of commands, addresses, and/or data between one or more originating devices and/or destination devices and a set of memory "vaults" 110. A vault is a vertical partition through a stack of memory dies containing a portion of the memory section of each memory die. The portion may be one or more memory arrays of the memory die. The stack of memory devices can be divided into any number of vaults. Examples of destination devices include one or more processors.

Multi-die memory array embodiments can aggregate control logic that is normally located on each individual memory array die in previous designs. Subsections of a stacked group of dies, referred to herein as memory vaults, are shown as example vault 110 in FIG. 1 and as example vault 230 in FIG. 2. The memory vaults shown in the illustrated examples can share common control logic. The memory vault architecture strategically partitions memory control logic to increase energy efficiency, while providing granularity with respect to powered-on memory banks. In various embodiments, memory device 100 can operate using a standardized host processor to memory system interface. The standardized interface may reduce re-design cycle times as memory technology evolves.

Figure 2:
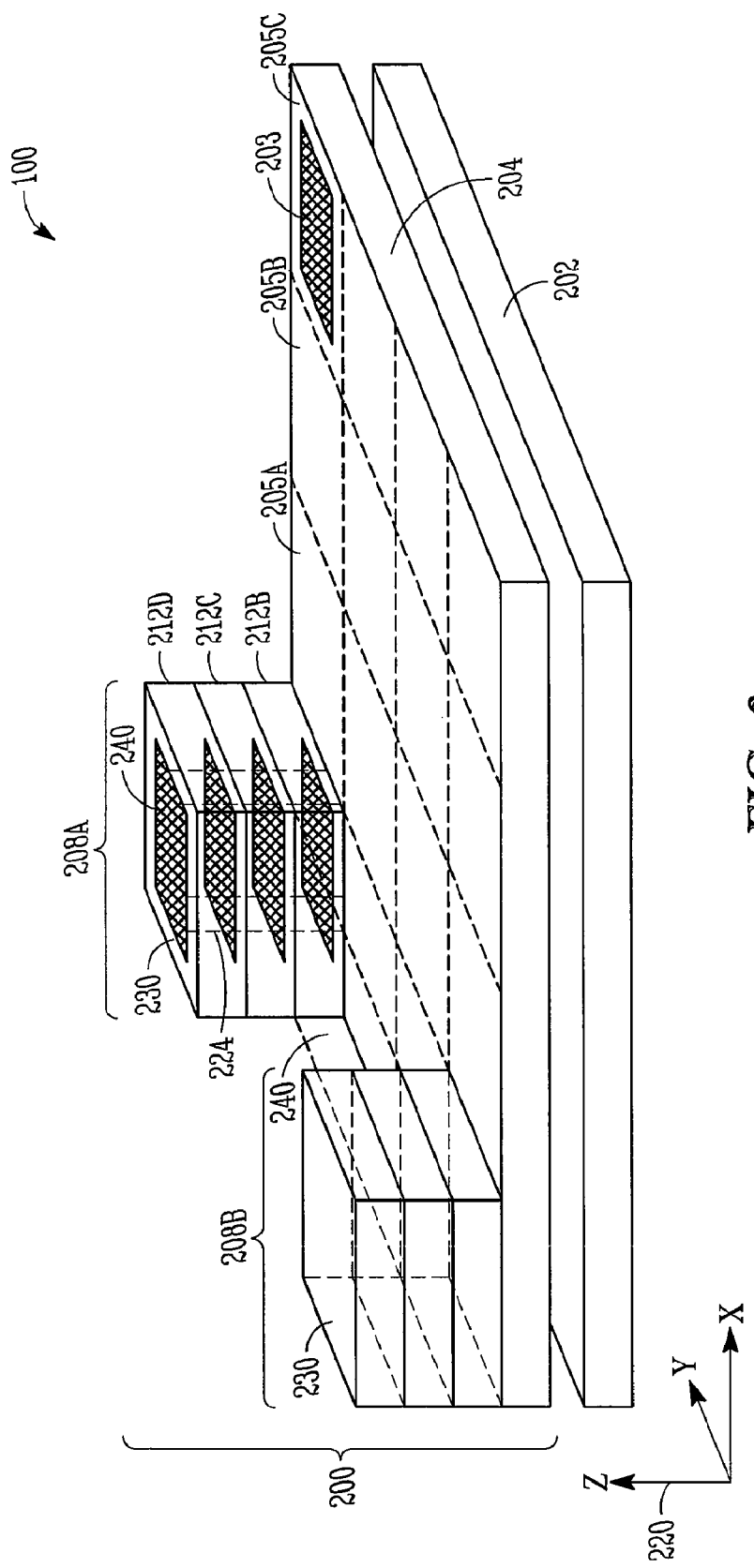
FIG. 2 illustrates a conceptual view of a 3-dimensional stack of individual memory dies stacked with a logic die to form a memory device, according to various example embodiments.

FIG. 2 is a conceptual view of a 3D stack 200 of individual memory dies stacked with a logic die 202 to form a memory device 100, according to various example embodiments. The memory device 100 incorporates one or more stacks of memory arrays 203 that form a part of the 3D stack 200. Multiple memory arrays, such as memory array 203, can be fabricated onto each of a plurality of dies, such as die 204. The dies are then stacked to form the 3D stack 200.

Each die of stack 200 is divided into multiple "tiles," for example, tiles 205A, 205B, and 205C associated with die 204 of stack 200. Each tile may include one or more memory arrays 203. The memory arrays 203 are not limited to any particular memory technology and may include dynamic random-access memory (DRAM), static random access memory (SRAM), flash memory, other memory technologies, or combinations thereof.

A stacked set 208A of memory array tiles may include a single tile from each of the stacked dies, such as tiles 212B, 212C, and 212D, with the base tile hidden from view in FIG. 1. Titles 212B, 212C, and 212D are part of different dies, which are not shown in FIG. 1 in their entirety to avoid obscuring the various embodiments and to facilitate discussion of the stacked tiles. Power, address, and/or data (and similar common signals) can traverse the stacked set 208A of tiles in the "Z" dimension 220 along conductive paths, such as conductive path 224, using "through-wafer interconnects" (TWIs). It is noted that a TWI need not necessarily pass entirely through a particular wafer or die.

The 3D stack 200 in an example configuration is partitioned into a set of memory vaults, such as memory vault 230. Each memory vault includes a stacked set of tiles, such as set 208A of tiles, comprising one tile from each of a plurality of stacked dies, together with a set of TWIs to electrically interconnect the set 208A of tiles. Another vault 208B is shown in FIG. 2. For discussion purposes, not all of the vaults of 3D stack 200 are shown. Each tile of the vault includes one or more memory arrays, such as memory array 240. Although partitions into individual vaults 230 are described, the 3D stack 200 can be partitioned in a number of other ways also. Other example partitions include partitioning by dies, tiles, and other partitioning arrangements. For ease of discussion, FIG. 1 indicates a stack of four dies above logic die 202, each die partitioned into sixteen titles which can form sixteen vaults, though only two vaults are shown. However, stack 200 is not limited to four dies and each die is not limited to sixteen partitions. Stack 200 can include thirty-two or more vaults. Any reasonable number of dies and partitions can be used, depending on the application.

As shown in FIG. 2, stack 200 includes a stack of memory dies, where each memory die can be partitioned into a plurality of memory arrays 203. Each memory array 203 can be disposed in a portion of a vault of the stack, where the stack has a plurality of vaults 230. Memory device 100 can be configured such that stack 200 can be arranged to store user data and/or first level error correction data in a stripe 240 across the vaults 230 of stack 200 such that data to be stored in stack 200 can be striped across multiple vaults 230. For each stripe, a vault 230 can be used for a second level of error detection/correction, where such a vault 230 may be referred to as a parity vault, for example. A first level of error detection/correction includes a single-bit error correction. For purposes of the discussion hereafter, the vaults storing the user data and/or the first level of error correction data are referred to generally as "data vaults." In a non-limiting example, sixty-four bytes of user data and/or first level error correction data can be stripped across four vaults with sixteen bytes per vault. Parity data can be generated for each bit from an exclusive-or (XOR) operation of each bit in the slice. For bit zero from each of the four vaults, the XOR operation can be performed such that for every bit zero that is written at the bit zero time for storage in stack 200, a bit zero parity bit can be written. For thirty-two bits, this procedure can be executed for each bit location one up to bit thirty-one. Each parity bit can be written into the parity vault. A data slice, in this example, is the four vaults 230 together at a bit time. The procedure, for this example, can be considered as sixty-four bytes being cut into four vaults. A data slice effectively makes up a parity equation so that, at the first bit time, the four vaults and its parity create a slice of data. Four slices of data and the parity vault can be used to reconstruct the data in response to a read request.

Stripe 240 is shown in FIG. 1 as including title 212C of an each vault 230 along a line in the direction Y from one end of a die to the opposite end. However, stripe 240 can be formed of portions of multiple vaults 230, where the portions can be distributed at various locations on a die and/or on various dies. Thus, stripe 240 can be a virtual stripe defined by the vaults selected to store the data. A parity vault can be disposed as one of the vaults of the stack such that stripe 240 includes a portion of the parity vault. The parity vault operatively stores parity data corresponding to the user data and/or first level error correction data in the stripe. As shown in FIG. 2, stripe 240 includes three vaults for user data and/or first level error correction data and one parity vault. With four vaults for user data and/or first level error correction data along the line in the direction Y, stripe 240 includes a parity vault that is a vault that is not disposed (and not shown in FIG. 2) along the line in the direction Y from one end of a die to the opposite end. Alternatively, the parity vault can be vault 230 at the front end of stack 200 with one of the vaults for user data and/or first level error correction data not along the line in the direction Y with the other three vaults of user data and/or first level error correction data. The management of the allocation of vaults to a stripe can be controlled in logic die 202. Control of such allocation in logic die 202 allows for transparent memory vault operation with respect to a user entity, such as a host processor, and for implementation of a standardized interface of memory device 100 with a host processor.

Parity data can be written into the parity vault as user data and/or first level error correction data is written into stack 200. The parity vault and each data vault can have a same number of bytes. The configuration of the number of vaults 230 assigned to data storage along with a parity vault can be programmable by a user entity, such as host processor(s) 114 of FIG. 1. Memory device 100 can implement multiple striping schemes. For example, stack 200 can include sixteen vaults arranged to have three stripes per memory die. Alternatively, stack 200 can include sixteen vaults arranged to have four stripes per memory die. Selection of the number of stripes per die or the number of data vaults per stripe is one of a number of programmable features. The programmable features can include a selection on the transfer size of data to memory device 100. For example, a user entity can set the transfer to sixty-four bytes or 256 bytes per transfer. Other transfer sizes can be used. The selection can be related to what size a particular host system or processor is using as a transfer size with a memory system. Once user entity identifies the vaults for user data and/or first level error correction data and the vault(s) for parity data, memory device 100 controls the operation of the vaults of stack 200 for normal memory operations and error correction.

Various arrangements of vaults 230 can be used. For instance, seven data vaults per one parity vault can be used instead four data vaults per one parity vault. Striping the user data and/or first level error correction data across multiple vaults provides a method to correct failed data for more than a single bit correction. However, as the number of vaults increases, efficiency of the memory technology operation may decrease. The vaults operate more efficiently if the transfer of data includes a longer data transfer. For example, sixty-four bytes transferring to one vault can be more efficient than transferring each one of eight bytes of the sixty-four bytes going to one of eight different vaults.

A set of memory vaults 102, similar to memory vaults 230 from FIG. 2, is illustrated in FIG. 1 in context within memory device 100. Memory device 100 also includes a plurality 104 of memory vault controllers (MVCs), for example MVC 106. Each MVC is communicatively coupled to a corresponding memory vault such as memory vault 110 of set 102, in a one-to-one relationship. Each MVC is thus capable of communicating with a corresponding memory vault independently from communications between other MVCs and their respective memory vaults.

Memory device 100 also includes a plurality of configurable serialized communication link interfaces (SCLIs) 112. SCLIs 112 are divided into an outbound group of SCLIs 113 and an inbound group of SCLIs 115, where "outbound" and "inbound" directions are defined from the perspective of processor(s) 114. Each SCLI of the plurality of SCLIs 112 is capable of concurrent operation with the other SCLIs. Together the SCLIs 112 communicatively couple the plurality of MVCs 104 to one or more host processor(s) 114. The memory device 100 thus presents a multi-link, high-throughput interface to host processor(s) 114.

Memory device 100 may also include a switch 116. In various embodiments, the switch 116 can comprise a matrix switch, which can also be referred to as a cross connect switch. Switch 116 is communicatively coupled to the plurality of SCLIs 112 and to the plurality of MVCs 104. Switch 116 is capable of cross-connecting each SCLI to a selected MVC. Host processor(s) 114 can thus access the plurality of memory vaults 102 across the plurality of SCLIs 112 in a substantially simultaneous fashion. This architecture can provide high processor-to-memory bandwidth operation to support modern processor technologies, including multi-core technologies.

Memory device 100 may also include a memory fabric control register 117 coupled to switch 116. Memory fabric control register 117 accepts memory fabric configuration parameters from a configuration source and configures one or more components of the memory device 100 to operate according to a selectable mode. For example, switch 116 and each of the plurality of memory vaults 102 and the plurality of MVCs 104 may be configured to operate independently of each other in response to separate memory requests. Such a configuration can enhance memory system bandwidth as a result of the parallelism between SCLIs 112 and memory vaults 102.

Alternatively, memory device 100 may be reconfigured via memory fabric control register 117 to cause a subset of two or more of the plurality of memory vaults 102 and a corresponding subset of MVCs to operate synchronously in response to a single request. The latter configuration may be used to access a data word that is wider than the width of a data word associated with a single vault. Such a word is herein referred to as a wide data word. This technique may decrease latency in a reading operation. Other configurations may be enabled by loading a selected bit pattern into the memory fabric control register 117.

In an example, outbound SCLIs 113 can include a plurality of outbound differential pair serial paths (DPSPs) 128. DPSPs 128 are communicatively coupled to host processor(s) 114 and may operate to collectively transport an outbound packet. Outbound SCLI 113 may also include a deserializer 130 coupled to the plurality of outbound DPSPs 128. Outbound SCLI 113 may also include a demultiplexer 138 communicatively coupled to the deserializer 130. In various embodiments, the configuration of DSPSs, deserializers, and demultiplexers facilitates efficient outbound transfer of data packets and sub-packets. Similar to the outbound SLCIs, in various embodiments, the inbound SCLIs and a similar configuration of DSPSs, serializers, and multiplexers facilitate efficient inbound transfer of data packets and sub-packets.

Figure 3:
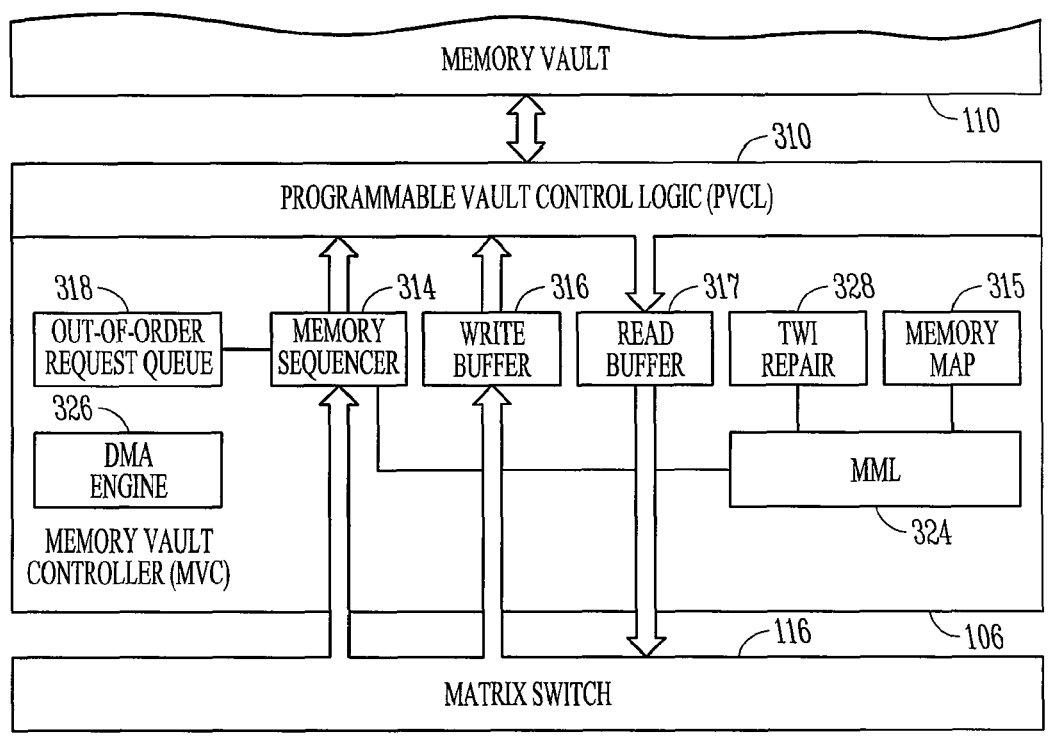
FIG. 3 shows a block diagram of a memory vault controller and associated modules, according to various example embodiments.

FIG. 3 is a block diagram of a memory vault controller 106 and associated modules according to various example embodiments. MVC 106 can include a programmable vault control logic (PVCL) component 310. PVCL 310 interfaces MVC 106 to a corresponding memory vault, for example memory vault 110. PVCL 310 generates one or more control signals and/or timing signals associated with the corresponding memory vault 110.

PVCL 310 can be configured to adapt the MVC 106 to a memory vault 110 of a selected configuration or a selected technology. Thus, for example, memory device 100 may initially be configured using currently-available DDR2 DRAMs. Memory device 100 may subsequently be adapted to accommodate DDR3-based memory vault technology by reconfiguring PVCL 310 to include DDR3 bank control and timing logic.

MVC 106 includes a memory sequencer 314 communicatively coupled to PVCL 310. Memory sequencer 314 performs a memory technology dependent set of operations based upon the technology used to implement associated memory vault 110. Memory sequencer 314 may, for example, perform command decode operations, memory address multiplexing operations, memory address demultiplexing operations, memory refresh operations, memory vault training operations, and/or memory vault prefetch operations associated with corresponding memory vault 110. In various embodiments, memory sequencer 314 may comprise a DRAM sequencer. In various embodiments, memory refresh operations may originate in a separate refresh controller (not shown).

Memory sequencer 314 can be configured to adapt memory device 100 to a memory vault 110 of a selected configuration or technology. For example, memory sequencer 314 can be configured to operate synchronously with other memory sequencers associated with the memory device 100. Such a configuration may be used to deliver a wide data word from multiple memory vaults to a cache line (not shown) associated with host processor(s) 114 in response to a single cache line request.

MVC 106 can also include a write buffer 316. The write buffer 316 can be coupled to PVCL 310 to buffer data arriving at MVC 106 from host processor(s) 114. MVC 106 can further include a read buffer 317. Read buffer 317 can be coupled to PVCL 310 to buffer data arriving at MVC 106 from corresponding memory vault 110.

MVC 106 can also include an out-of-order request queue 318. Out-of-order request queue 318 establishes an ordered sequence of read and/or write operations from/to the plurality of memory banks included in memory vault 110. The ordered sequence is chosen to avoid sequential operations to any single memory bank in order to reduce bank conflicts and to decrease read-to-write turnaround time.

The MVC 106 may also include a memory map logic (MML) component 324. MML 324 can manage a number of operations such as TWI repair operations using TWI repair logic 328, as well as other repair operations. In an example, MML 324 tracks multiple error data for multiple portions of the 3D stack 200. A number of different portions can be tracked using the MML 324. In an example, error data is tracked for each die 204. Other examples include tracking error data for each tile 205, each array 203, and other forms of partitioning memory of stack 200.

MVC 106 can include a direct memory access (DMA) engine 326 that reads the vaults in a stripe, which includes a parity vault, and can rebuild a bad vault in a spare vault if available. Consider, for example, stack 200 arranged with sixteen vaults that uses four data vaults+one parity vault striping, which defines a stripe of five vaults. With five vaults per stripe, of the sixteen vaults of stack 200, fifteen vaults are used for user data and/or first level error correction data and parity data. One vault of the sixteen vaults remains unallocated and can be used as a spare vault. Note that if stack 200 arranged with sixteen vaults uses four stripes with three data vaults+one parity vault striping, all of the sixteen vaults would be allocated with no spare vault. Using the four data vaults+one parity vault striping, if a vault fails, the user data and/or first level error correction data can be rebuilt in the spare vault. Rebuilding of the user data and/or first level error correction data in the faulty vault into the spare vault can be transparent to the user entity, such as host processor(s) 114, since the determination of the faulty vault and rebuilding is controlled within memory device 100. DMA engine 326, using the data in the parity vault, can read the five vaults, determine which is the faulty vault, and rebuild the faulty vault in the spare vault. Once DMA engine 236 rebuilds user data and/or first level error correction data in the faulty vault into the spare vault, the faulty vault can be removed from use. A notification can be sent to the user entity. DMA engine 236 can be distributed among the MVCs of logic die 202. DMA engine 236 can be structured as a separate component on logic die 202 separate from the MVCs of logic die 202. DMA engine 236 can be coupled to separate MVCs of logic die 202.

In various embodiments, parity data can be generated as user data and/or first level error correction data is written into stack 200 of memory device 100 and can be stored in a parity vault of stack 200. In various embodiments, parity correction may be applied only if the read of the data of stripe 240 fails. For single bit corrections of data, a first level error correction vault, which is a data vault, can be used to make the single bit corrections without using parity data. However, single bit corrections of data can also or alternatively be conducted with parity data, with respect to the data being read, stored in the parity vault. If a read fails beyond what the first level of error correction can correct, the second level of error correction (e.g., parity correction) can be used to correct the bad data in the read operation. Further, if a vault fails, the striped vaults can be read including the parity vault to correct all data in the faulty vault. This correction procedure can be conducted such that the correction is transparent to a user entity, such as host processor(s) 114, since the determination of the faulty vault and rebuilding is controlled within memory device 100.

The data in a memory structure similar to or identical memory device 100 having stack 200 can also be checked by a scrubbing routine. A scrubbing routine can operate to periodically check the validity of data memory and correct faults found from checking of the data. Instead of a host or a processor accessing the data in stack 200, DMA engine 326 or an onboard processor on logic die 202 can be used to read every location periodically to determine if any there are data failures and/or vault failures. If there are failures, the data can be corrected and written into a location in the spare vault such that the data is maintained in a good (non-faulty) area of stack 200.

Figure 4:
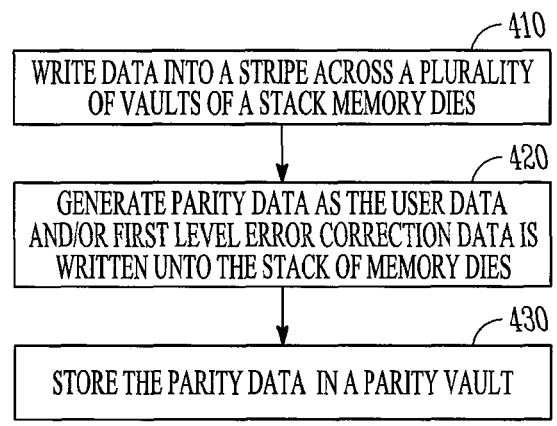
FIG. 4 shows features of an embodiment of a method of writing data into a memory stack.

FIG. 4 shows features of an embodiment of a method of writing data into a memory stack, according to various example embodiments. At 410, data is written into a stripe across a plurality of vaults of a stack of memory dies. Each memory die can be partitioned into a plurality of memory arrays such that each memory array is disposed in a portion of a vault of the stack. Along with user data, first level of error correction data (e.g., an error correction code) for the user data can be stored as data in the stack of memory dies. Writing data into the stripe can includes distributing the data across non-faulty vaults of the stack of memory dies such that a spare partition is available to rebuild a faulty vault. The vaults need not be contiguous partitions with respect to other partitions in the stripe. At 420, parity data is generated as the user data and/or first level error correction data is written into the stack of memory dies. At 430, the parity data is stored in a parity vault. The parity vault can be disposed as one of the vaults of the stack such that the stripe includes a portion of the parity vault, the parity corresponding to the user data and/or first level error correction data in the stripe.

Figure 5:
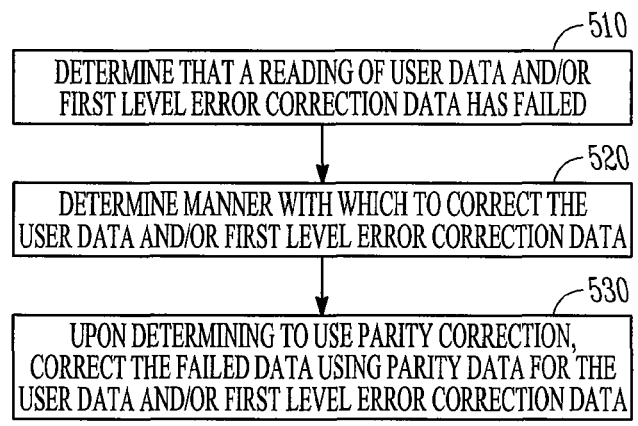
FIG. 5 shows features of an embodiment of a method of correcting data in a memory device.

FIG. 5 shows features of an embodiment of a method of correcting data in a memory device, according to various example embodiments. At 510, a reading of user data and/or first level error correction data is determined to have failed. The determination can include determining that the failed data is from a stripe across a plurality of vaults of a stack of memory dies. Each memory die can be partitioned into a plurality of memory arrays such that each memory array is disposed in a portion of a vault of the stack. The stack can have a plurality of vaults.

At 520, the manner with which to correct the user data and/or first level error correction data is determined. The manner of determination can include a trial and error process. The manner of correction can include applying a first level of error correction to the faulty data. The first level error correction data can be accessed in a vault disposed in the stack of memory dies as an error correction code partition. An error correction code can be used to make single bit corrections. If the application of the error correction code does not correct the faulty data, parity correction can be applied. Alternatively, parity correction can be applied to make single bit corrections.

At 530, upon determining to use parity correction, the failed data is corrected using parity data for the user data and/or first level error correction data. The parity data can be correlated with the stripe containing the user data and/or first level error correction data and associated parity data. The parity data can be stored in a parity vault that can be disposed as one of the vaults of the stack such that the stripe includes a portion of the parity vault. To correct a faulty vault, the plurality of striped vaults can be read along with reading the parity vault upon determining that a fault fails. Multiple errors in a vault can be treated as a complete failure of the vault. Data failure and/or vault failure can be corrected without interaction with a user entity of the stacked of memory dies. After correcting a vault failure, a user entity of the stacked of memory dies can be notified that a vault has failed. The notification can include notification of the correction of the data rebuilt in a spare vault.

Figure 6:
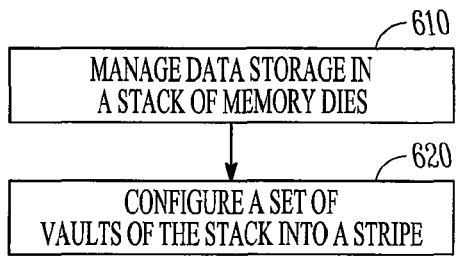
FIG. 6 shows features of an embodiment of a method of operating a memory device having a stack of memory dies.

FIG. 6 shows features of an embodiment of a method of operating a memory device having a stack of memory dies, according to various example embodiments. At 610, data storage in a stack of memory dies is managed. Each memory die can be partitioned into a plurality of memory arrays such that each memory array is disposed in a portion of a vault of the stack. The stack can have a plurality of vaults.

At 620, a set of the vaults is configured into a stripe. The stripe can have an arrangement of vaults for user data and/or first level error correction data and a vault for parity data. The parity data is correlated to the user data and/or first level error correction data. The plurality of vaults can be configured to include a data vault as a first level error correction vault. In an embodiment, the total number of vaults of the stack can include sixteen vaults configured for data striping with four vaults for user data and/or first level error correction data and one vault for parity data. In other embodiments, the total number of vaults can be different than sixteen configured for data striping with four vaults for user data and/or first level error correction data and one vault for parity data or configured for data striping with a different arrangement of vaults for user data and/or first level error correction data and parity data. In various embodiments, the total number of vaults of the stack can be thirty-two or more. In various embodiments, the stack can be arranged with a configuration that includes one or more vaults as spare vaults.

In various embodiments, a machine-readable storage medium stores instructions, which when performed by a machine, cause the machine to perform operations comprising managing data storage in a stack of memory dies. The stored instructions can be executed by a user entity such as one or more processors. Each memory die can be partitioned into a plurality of memory arrays such that each memory array is disposed in a portion of a vault of the stack. The stack can have a plurality of vaults. To manage the stack, the machine-readable storage medium can include instructions configuring a set of the vaults into a stripe, the stripe having an arrangement of vaults for user data and/or first level error correction data and a vault for second level error correction data, such as parity data. The set of vaults of the stripe can be configured with a data vault storing first level error correction data. In an embodiment, the instructions include configuring fifteen vaults for data and parity. The instructions can include configuring sixteen vaults for data striping with four vaults for user data and/or first level error correction data and one vault for parity data. A vault can be allocated as a spare partition. In various embodiments, the total number of vaults of the stack can be thirty-two or more. In various embodiments, the stack can be arranged with a configuration that includes one or more vaults as spare partitions.

Other configurations of vaults for data and parity can be implemented. The stored instructions allow the set of vaults to be configured under the programmable control of a user entity. The machine-readable storage medium can be realized by any form of storage technology and is not limited to any one technology. For instance, the instructions can be stored in a processor chip that includes memory.

In various embodiments, a memory structure, having a stack of memory dies, can be arranged with vaults such that user data and/or first level error correction data written into the memory structure can be striped across a plurality of vaults with second level error correction data, such as parity data, for the user data and/or first level error correction data written into a dedicated vault. As the density of data storage on a die increases and/or the speed of memory access increases, the number of vaults per die can also increase providing additional vaults for parity vaults and spare vaults that can effectively address data faults as they occur in operation, without incurring inefficiencies associated with transferring small groups of data. Correcting faulty data or faulty regions of a die can be conducted transparently with respect to a user entity. Each die of the memory structure can be fabricated using conventional techniques and then mounted vertically. The vertical mounting can be made with respect to a logic chip. Alternatively, the logic chip for controlling access to the stack of memory dies can be coupled to the stack without being in the vertical mounting. The stack of memory dies and logic die can be formed in other apparatus and may be formed as part of a system.

Figure 7:
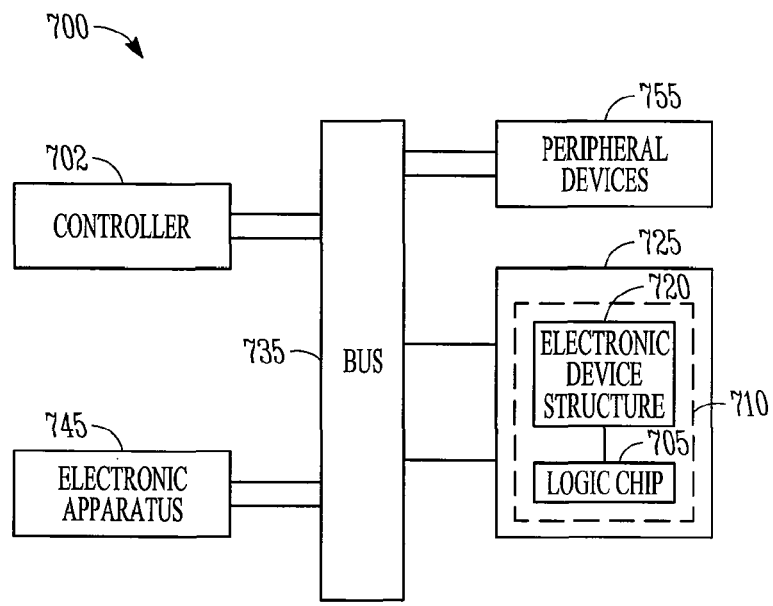
FIG. 7 shows a block diagram of various features of an electronic system, according to various embodiments of the invention.

FIG. 7 shows a block diagram of various features of an electronic system 700, according to various embodiments of the invention. System 700 can include a controller 702 an apparatus 725 having memory device 710 including a logic chip 705 coupled to a stack 720 of memory dies. Memory device 710 including logic chip 705 coupled to stack 720 of memory dies can be structured and operated in a manner similar to or identical to the embodiments discussed with respect to FIGS. 1-6. System 700 may be formed in various ways such as coupling the individual components of system 700 together or integrating the components into one or a number of chip-based units using conventional techniques. In an embodiment, system 700 also includes an electronic apparatus 745 and a bus 735, where bus 735 provides electrical conductivity between controller 702 and electronic apparatus 745 and between controller 702 and apparatus 725. In an embodiment, bus 735 includes an address bus, a data bus, and a control bus, each independently configured. In an alternative embodiment, bus 735 uses common conductive lines for providing one or more of address, data, or control, the use of which is regulated by controller 702. In an embodiment, electronic apparatus 745 may include memory for the intended functional applications of electronic system 700.

With memory 710 arranged as a stack 720 of memory dies, the types of memory dies may include, but are not limited to, dynamic random access memory, static random access memory, synchronous dynamic random access memory (SDRAM), synchronous graphics random access memory (SGRAM), double data rate dynamic ram (DDR), and double data rate SDRAM, arranged according to the various embodiments as taught herein. Structures of various embodiments of apparatus 725 having memory device 710 including logic chip 705 coupled with stack 720 of memory dies, in accordance with various embodiments as illustrated in FIGS. 1-6, may be realized in simulation packages that may be arranged as software, hardware, or a combination of software and hardware packages to simulate various embodiments and/or the operation of various embodiments.

In various embodiments, peripheral device or devices 755 are coupled to bus 735. Peripheral devices 755 may include displays, imaging devices, printing devices, wireless devices, wireless interfaces (e.g. wireless transceivers), additional storage memory, control devices that may operate in conjunction with controller 702. In an embodiment, controller 702 can include a processor. In various embodiments, system 700 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A stack of memory dies comprising:
 a plurality of data vaults, the stack arranged to store user data and/or first level error correction data in a stripe across the data vaults; and
 a vault to operatively store second level error correction data corresponding to the user data and/or first level error correction data in the stripe.

2. The stack of claim 1, wherein the second level error correction vault includes a parity vault.

3. The stack of claim 1, wherein the plurality of data vaults includes a vault containing first level error correction data.

4. The stack of claim 1, wherein the second level error correction vault and each of the data vaults are arranged to store a same number of bytes.

5. The stack of claim 1, wherein configuration of the stripe and the second level error correction vault is programmable.

6. The stack of claim 1, wherein the stack includes sixteen vaults arranged to have three stripes per memory die.

7. The stack of claim 1, wherein the stack is disposed on a logic die, the logic die including a direct memory access engine or an onboard processor to read every memory location of the stack of memory dies periodically to determine if any there are user data and/or first level error correction data failures and/or vault failures.

8. A stack of memory dies comprising:
 a plurality of data vaults, the stack arranged to store user data and/or first level error correction data in a stripe across the data vaults;
 a second level error correction vault to operatively store second level error correction data corresponding to the user data and/or first level error correction in the stripe;
 a spare vault available to store user data and/or first level error correction data upon determining that one of the data vaults has become faulty; and
 a controller to correct user data and/or first level error correction data read from the stripe.

9. The stack of claim 8, wherein the stripe includes a first level error correction vault and the controller is operable to use the first level error correction vault to make a single bit correction of user data read from the stripe.

10. The stack of claim 8, wherein the controller is operable to read user data and/or first level error correction data and parity data from a stripe to correct the user data and/or first level error correction data.

11. The stack of claim 8, wherein the controller includes a direct memory access engine operable to rebuild a faulty vault in the spare vault.

12. The stack of claim 8, wherein the number of data vaults allocated is programmable.

13. The stack of claim 8, wherein the stack is disposed on a logic die, the logic die including a direct memory access engine.

14. The stack of claim 13, wherein the direct memory access engine is configured to rebuild user data and/or first level error correction data in a faulty vault into the spare vault.

15. The stack of claim 8, wherein the direct memory access engine is distributed among memory vault controllers of the logic die.

16. The stack of claim 8, wherein the direct memory access engine is structured as a component on the logic die, separate from a plurality of memory vault controllers of the logic die, the direct memory access engine coupled to each of the memory vault controllers.

17. A method comprising:
writing user data and/or first level error correction data into a stripe across a plurality of vaults of a stack of memory dies;
generating second level error correction data corresponding to the user data and/or first level error correction data; and
storing the second level error correction data in a second level error correction vault of the stack.

18. The method of claim 17, wherein generating second level error correction data includes generating the second level error correction data as the user data and/or first level error correction data is written into the stack of memory dies.

19. The method of claim 17, wherein storing the second level error correction data includes storing the second level error correction data in the second level error correction vault of the stack such that the stripe includes a portion of the second level error correction vault, the second level error correction data corresponding to the user data and/or first level error correction data in the stripe.

20. The method of claim 17, wherein writing user data and/or first level error correction data comprises storing first level error correction data in one of the plurality of vaults.

21. The method of claim 17, wherein writing data into the stripe across the plurality of vaults of the stack of memory dies includes distributing the user data and/or first level error correction data across non-faulty vaults of the stack of memory dies such that a spare vault is available to rebuild a faulty vault.

22. A method comprising:
determining whether a reading of user data and/or first level error correction data from a stripe across a plurality of vaults of a stack of memory dies has failed;
if the reading has failed, determining the manner with which to correct the user data and/or first level error correction data; and
upon determining to use second level error correction, correcting the user data and/or first level error correction data using second level error correction stored in a second level error correction vault.

23. The method of claim 22, wherein the method includes making a determination to use the second level error correction if a first level of error correction does not correct the failure.

24. The method of claim 22, wherein determining the manner with which to correct the data includes determining whether to use the first level error correction data.

25. The method of claim 24, wherein the method includes accessing a vault of the stripe that stores the first level error correction data.

26. The method of claim 22, wherein the method includes reading the plurality of striped vaults along with reading the second level error correction vault upon determining that a vault has failed.

27. The method of claim 26, wherein the method includes notifying a user entity of the stacked of memory dies that a vault has failed.

28. The method of claim 22, wherein the method includes correcting user data and/or first level error correction data without interacting with a user entity of the stacked of memory dies.

29. A method comprising:
managing data storage in a stack of memory dies, the stack having a plurality of vaults, the managing including configuring a set of the vaults into a stripe, the stripe having an arrangement of vaults for user data and/or first level error correction data and a vault for second level error correction data.

30. The method of claim 29, wherein configuring the set of vaults includes configuring one of the plurality of vaults as a first level error correction vault.

31. The method of claim 29, wherein the method includes configuring sixteen vaults of the plurality of vaults for data striping with four vaults for user data and/or first level error correction data per stripe and one vault for second level error correction data.

32. The method of claim 29, wherein the method includes configuring a vault as a spare vault.

33. A machine-readable storage device that stores instructions, which when performed by a machine, cause the machine to perform operations, the operations comprising:
managing storage of user data and/or first level error correction data into a stripe across a stack of memory dies, the managing including applying second level error correction data to correct a failure in reading the user data and/or first level error correction data from the stripe, the second level error correction data applied if the read fails beyond that which first level error correction data can correct.

34. The machine-readable storage device of claim 33, wherein the instructions include periodically reading every memory location in the stack of memory dies to determine if any there are data failures and/or vault failures.

35. The machine-readable storage device of claim 33, wherein applying second level error correction data includes applying parity correction, the parity correction used if a read of the user data and/or first level error correction data from the stripe fails.

* * * * *

UNITED STATES PATENT AND TRADEMARK OFFICE
CERTIFICATE OF CORRECTION

PATENT NO.        : 8,327,225 B2
APPLICATION NO.   : 12/651910
DATED             : December 4, 2012
INVENTOR(S)       : Joe M. Jeddeloh Page 1 of 1

It is certified that error appears in the above-identified patent and that said Letters Patent is hereby corrected as shown below:

In the Claims:

In column 10, line 46, in Claim 7, delete "any there are" and insert -- there are any --, therefor.

In column 12, line 53, in Claim 34, delete "any there are" and insert -- there are any --, therefor.

Signed and Sealed this
Sixteenth Day of July, 2013

Teresa Stanek Rea
*Acting Director of the United States Patent and Trademark Office*